United States Patent [19]
Schäffter et al.

[11] Patent Number: 5,767,676
[45] Date of Patent: Jun. 16, 1998

[54] MR SPECTROSCOPY METHOD FOR MEASURING PLURAL VOXELS AT INTERSECTIONS OF SLICES

[75] Inventors: Tobias Schäffter; Peter Börnert, both of Hamburg, Germany

[73] Assignee: U.S. Philips Corporation, New York, N.Y.

[21] Appl. No.: 812,180

[22] Filed: Mar. 6, 1997

[30] Foreign Application Priority Data

Mar. 13, 1996 [DE] Germany ............ 196 09 839.4

[51] Int. Cl.$^6$ ............................................. G01R 33/20
[52] U.S. Cl. ............................................. 324/309
[58] Field of Search ............ 324/307, 309, 324/300, 312, 314; 128/653.2, 653.1; 600/410

[56] References Cited

U.S. PATENT DOCUMENTS

| | | | |
|---|---|---|---|
| 4,480,228 | 10/1984 | Bottomley | 324/309 |
| 4,484,138 | 11/1984 | Bottomley | 324/307 |
| 4,893,080 | 1/1990 | Luyten | 324/309 |

FOREIGN PATENT DOCUMENTS

| | | | |
|---|---|---|---|
| 0339979A2 | 2/1989 | European Pat. Off. | |
| 0339979 | 4/1989 | European Pat. Off. | G01R 33/20 |

OTHER PUBLICATIONS

"Double–Echo Multislice Proton Spectroscopic Imaging Using Hadamard Slice Encoding" (1980) by Wolfgang Dreher et al, Multi–Slice Proton Spectroscopic Imaging, pp. 596–600.

"Fast Hadamard Spectroscopic Imaging Techniques" (1994) by Gadi Goelmam, Journal of Magnetic Resonance, Series B 104, pp. 212–218.

"Multiple–Line Scanning Spin Density Imaging" (1994) by A.A. Maudsley, Journal of Magnetic Resonance, 41, pp. 112–126.

"Transverse Hadamard Spectroscopic Imaging Technique" (1990) by Gadi Goelman et al, Journal of Magnetic Resonance, 89, pp. 437–454.

"Wavelet–Encoded MR Imaging" (1992) John B. Weaver et al, Magnetic Resonance in Medicine 24(1992) Apr., No. 2, Duluth, MN, US.

*Primary Examiner*—Sandra L. O'Shea
*Assistant Examiner*—Michael Eisenberg
*Attorney, Agent, or Firm*—Jack D. Slobod

[57] ABSTRACT

In an MR spectroscopy method nuclear magnetization of a plurality of voxels present at an area of intersection of two slices is simultaneously excited by repeated sequences, the resultant phase encoding of the voxels is varied from one sequence to another, and a spectral distribution of nuclear magnetization in the voxels is derived from linear combinations of the MR signals generated in the individual sequences. A method is obtained wherein each sequence a first slice-selective RF pulse is generated in order to excite the transverse magnetization in one or more first slices, and subsequently a second slice-selective RF pulse is generated in order to refocus nuclear magnetization in one or more second slices which intersect the first slices at an angle other than zero, and in the various sequences the MR signals produced by the spin echos in the voxels present at the area of intersection of each first and second slice is detected and used to determine the spectral distribution of the nuclear magnetization.

6 Claims, 3 Drawing Sheets

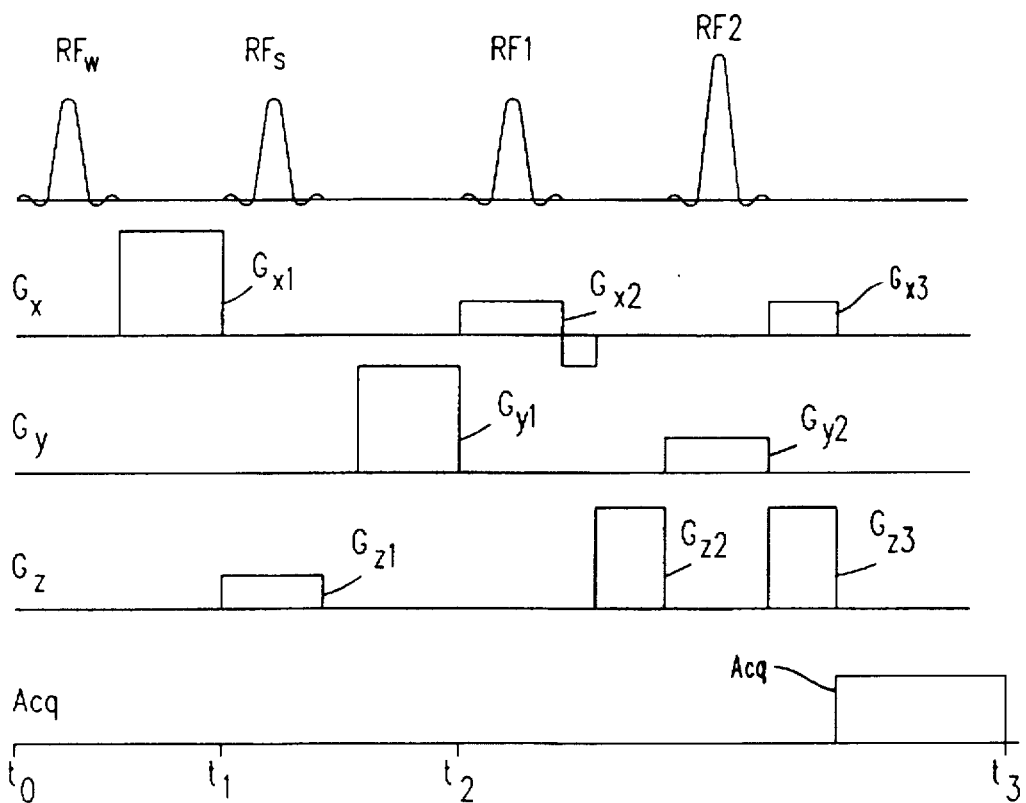
Fig. 2
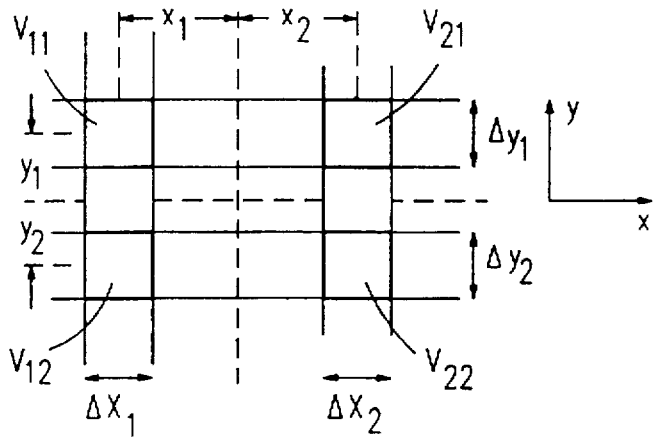
Fig. 3
```
+  +      +  -      +  +      +  -
+  +      +  -      -  -      -  +
```
Fig. 4A    Fig. 4B    Fig. 4C    Fig. 4D

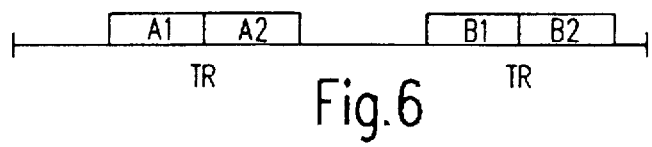
Fig.5A  Fig.5B
Fig.6
Fig.7A  Fig.7B
Fig.7C  Fig.7D
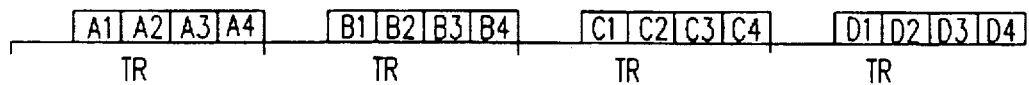
Fig.8

MR SPECTROSCOPY METHOD FOR MEASURING PLURAL VOXELS AT INTERSECTIONS OF SLICES

BACKGROUND OF THE INVENTION

1. Field of the Invention

The invention relates to an MR spectroscopy method in which the nuclear magnetization of a plurality of voxels present at the area of intersection of two slices is simultaneously excited by sequences which are repeated a number of times, the phase encoding of the voxels then occurring being varied from one sequence to another and the spectral distribution of the nuclear magnetization in the voxels being derived from linear combinations of the MR signals generated in the individual sequences; the invention also relates to a device for carrying out this method.

2. Description of the Related Art

Methods of this kind are known, for example from a) EP-OS 0 339 979 b) Goelman in J. Magn. Reson. B 104, pp. 212–218 (1994), and from c) Goelman et al in J. Magn. Reson. 89, pp. 437–454 (1990).

In comparison with MR methods in which the spectral distribution of the nuclear magnetization in the individual voxels is successively measured, the above methods offer the advantage of a better signal-to-noise ratio. In the methods described in a) and b), the longitudinal magnetization is first inverted slice by slice by one or two slice-selective 180° pulses. This encoding is read by means of a read pulse which converts the longitudinal magnetization throughout the examination zone, so not only in the voxels, into transverse magnetization. If the volume in which the 180° pulse was active is substantially smaller than the overall volume of the voxels, significant measuring errors are liable to occur. Within a sequence, or a repetition time, only one MR signal can be acquired, unless the longitudinal magnetization is not completely read (as sub b)), after which a further MR signal is extracted from the remaining longitudinal magnetization. However, the signal-to-noise ratio is thus degraded.

In the method known from c), a first 90° RF pulse excites the transverse magnetization in one or more slices. In addition to refocusing 180° pulses, the sequence includes two further 90° RF pulses which influence the nuclear magnetization in further slices which extend perpendicularly to the previously excited slices. The voxels are then defined by the area of intersection of three mutually perpendicular slices and the stimulated echo signals generated therein are read. It is a drawback of this method that 50% of the signal energy is lost in principle. A further drawback consists in that within one sequence this method cannot be applied to other voxels, unless the longitudinal magnetization excited by two preceding RF pulses at the area of intersection of the associated slices is not completely read by means of the third RF pulse. However, this approach involves a further signal loss so that the signal-to-noise ratio is degraded even further.

SUMMARY OF THE INVENTION

It is an object of the present invention to provide a method which functions perfectly even if the voxels examined are small in comparison with the overall volume and in which the nuclear magnetization previously excited in the voxels can be read without signal loss.

Thus, according to the invention the first slice-selective RF pulse, preferably being a 90° RF pulse, excites the transverse magnetization in mutually parallel first slices. The transverse magnetization in the various slices may then have the same or the opposed phase position.

The second slice-selective RF pulse, preferably being a 180° RF pulse, influences the nuclear magnetization in mutually parallel second slices in such a manner that the transverse magnetization is refocused exclusively at the area of intersection of the first and second slices. The second RF pulse may be shaped so that in one slice the phase position remains the same whereas in another slice the phase position is rotated 180° with respect thereto. To this end the second RF pulse must act with a phase shift of 90° in the various slices. Because of the cooperation between the two RF pulses in the areas of intersection of the first and the second slice, i.e. in the voxels, spin echos are produced therein with a corresponding phase encoding, without any loss of signal. The resultant MR signals are acquired and used for determining the MR spectrum in the voxels. Because spin echos occur exclusively in the voxels, the measuring accuracy is substantially independent of how large a part of the overall volume exposed to the two RF pulses is constituted by the voxels. Because the MR signals resulting from the spin echos are used for the evaluation, no signal loss occurs.

DETAILED DESCRIPTION OF THE PREFERRED EMBODIMENTS

Figure 1:
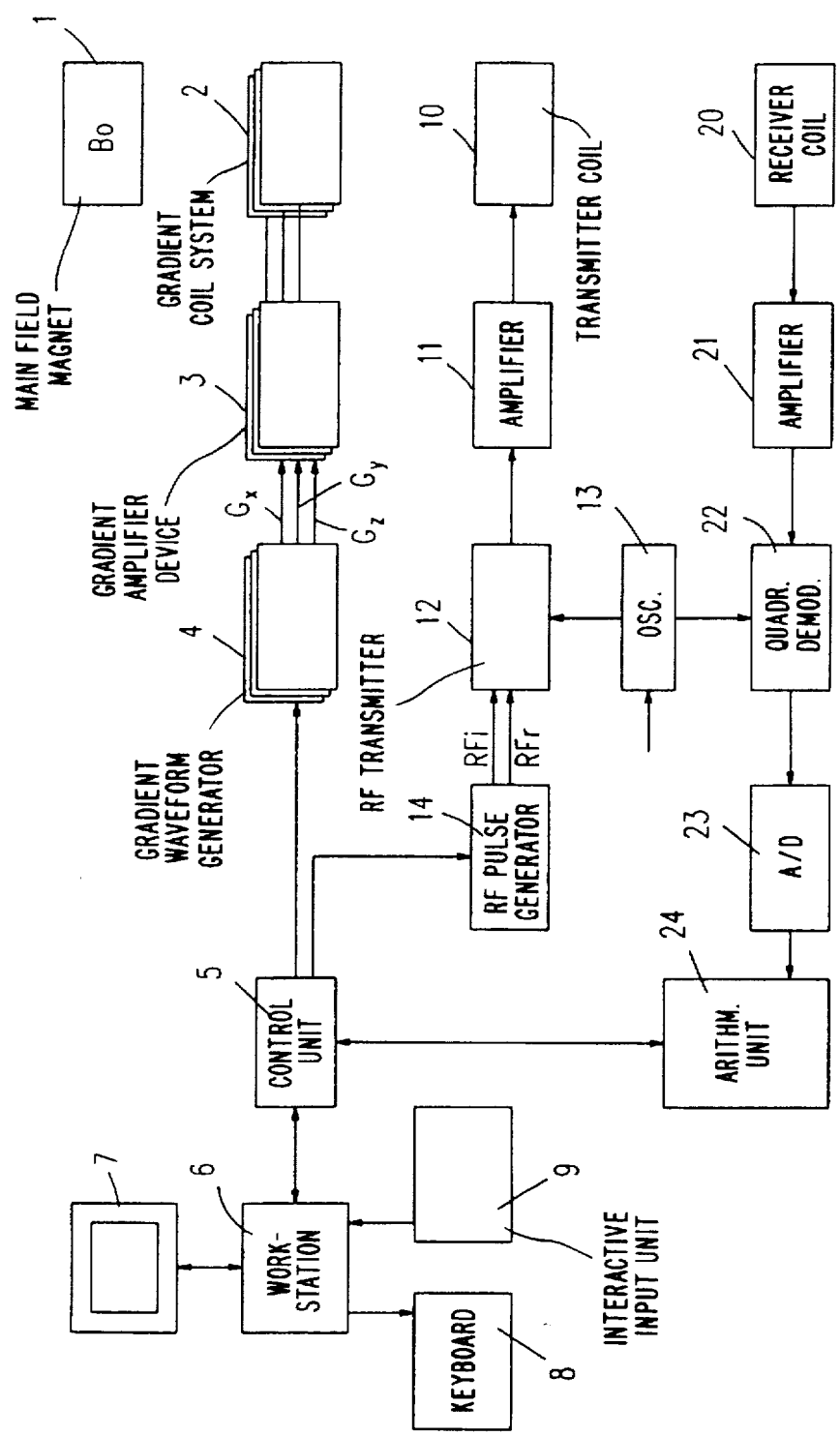

During the time interval between the first RF pulse and the reading of the MR signal the transverse magnetization is subject to the effect of the $T_2$ decay. Therefore, the method according to the invention is not very well suitable for the determination of substances having a small $T_2$ (for example, phosphorous), but particularly well suitable for proton spectroscopy.

Generally speaking, in the case of in vivo MR examinations of a patient it is desirable to determine the MR spectra in voxels defined in three dimensions. In a further version of the invention this is achieved in that, prior to the first RF pulse, at least one slice-selective RF pulse which is succeeded by a magnetic gradient field excites and dephases the nuclear magnetization in the areas to both sides of a slice which extends at an angle other than zero, preferably 90°, with respect to the first and second slices. Subsequently, the first and the second RF pulse have an effect only on the nuclear magnetization in said slice, so that the voxels are defined by the area of intersection of this slice and the first and second slices.

A preferred version of the invention is applied successively to at least two region patterns within one repetition period, which region patterns consist of a plurality of voxels which are arranged in such a manner that their nuclear magnetization is excited and refocused only once within a sequence. This enables examination of a plurality of region patterns, or a plurality of groups of voxels, within one sequence, or within one repetition period, that is to say without loss of signal, because the nuclear magnetization in the voxels of the relevant pattern was not previously excited.

In the case of in vivo MR proton spectroscopy, the MR signal originating from water-bound protons is some powers of ten larger than the component originating from the other protons. In order to suppress the water component, each sequence includes, prior to the first RF pulse, the excitation of the nuclear magnetization of the water-bound protons by at least one frequency-selective RF pulse and the subsequent dephasing of this nuclear magnetization by magnetic gradient fields.

The first RF pulse excites transverse magnetization in all first slices. This yields an FID signal which is superposed on the MR signal derived from the spin echo. In order to suppress the FID signal, in each sequence a first magnetic gradient field is generated in the interval between the first and the second RF pulse, in the interval between the second RF pulse and the acquisition of the MR signals there being generated a second magnetic gradient field whose time integral has the same value as that of the first magnetic gradient field. Because of the refocusing effect of the second RF pulse, the two magnetic gradient fields do not influence the transverse magnetization in voxels, whereas they dephase the transverse magnetization in all other parts of the first slices, so that these parts no longer supply disturbing FID signals.

An MR apparatus for carrying out the method of the invention includes a) an RF coil system for generating RF pulses,
b) a gradient coil system for generating temporally variable magnetic gradient fields,
c) a coil system for receiving MR signals,
d) a control unit for controlling the components in such a manner that the following steps are executed:
  d.1) generating sequences including
    a first slice-selective RF pulse for exciting the nuclear magnetization in one or more first slices, and
    a second slice-selective RF pulse for refocusing the nuclear magnetization in one or more second slices which intersect the first slices at an angle other than zero,
  d.2) varying the phase encoding of the voxels from one sequence to another,
  d.3) acquiring the MR signals occurring as spin-echos during the sequences,
  d.4) forming linear combinations of the MR signals, or MR data linearly derived, therefrom, in order to determine the spectral nuclear magnetization distribution in a respective one of the regions.

The invention will be described in detail hereinafter with reference to the drawings. Therein:

FIG. 1 shows an MR apparatus suitable for carrying out the invention,

FIG. 2 shows the variation in time of various signals in a sequence for carrying out the invention, FIG. 3 shows a region pattern consisting of four voxels, FIGS. 4a to 4d show the different phase encoding for this region pattern, FIGS. 5a and 5b show two groups of voxels which can be examined in successive sequences, FIG. 6 shows two sequences for examining the groups shown in the FIGS. 5a and b, FIGS. 7a to 7d show groups of voxels whereby a field of 8×8 voxels can be examined in four successive sequences, and FIG. 8 illustrates the execution in time of these four sequences.

The reference numeral 1 in FIG. 1 denotes a diagrammatically shown main field magnet which generates a steady, uniform magnetic field which has a strength of, for example 1.5 Tesla and extends in the z-direction in an examination zone (not shown). There is also provided a gradient coil system 2 which is capable of generating magnetic gradient fields which extend in the z-direction in the examination zone and have a gradient in the x, the y or the z direction. The gradient coil system 2 is fed by a gradient amplifier device 3. The variation in time of the magnetic gradient fields is predetermined by a generator device 4 which is controlled by a control unit 5. The control unit cooperates with a workstation 6. The workstation 6 includes a monitor 7 for the display of MR images or MR spectra. Entries can be made via a keyboard 8 or an interactive input unit 9.

The nuclear magnetization in the examination zone can be excited by RF pulses from an RF transmitter coil 10 which is connected to an RF amplifier 11 which amplifies the output signals of an RF transmitter 12. In the RF transmitter the complex envelopes $RF_i$ and $RF_r$, stored in a generator 14, for an RF pulse are modulated with two 90° offset carrier oscillations which are supplied by an oscillator 13 whose frequency corresponds to the Larmor frequency (approximately 63 MHz for a main field of 1.5 Tesla). The envelopes $RF_i$ and $RF_r$ required for the relevant RF pulse to be generated are loaded into the RF pulse generator 14 by the control unit 5.

The MR signals generated in the examination zone are picked up by a receiver coil 20 and amplified by an amplifier 21. The amplified MR signal is demodulated in a quadrature demodulator 22, thus yielding a complex signal which is applied, via an analog-to-digital converter, to an arithmetic unit 24 which is capable of determining the associated spectrum from the complex MR signals by Fourier transformation and is also capable of combining the various MR signals or spectra linearly in such a manner that the MR spectrum for a single voxel is obtained.

In MR spectrosopy it is advantageous to use an MR image so as to define the regions wherefrom an MR spectrum is to be determined. Because the absolute evaluation of such spectra is often ambiguous because of the large differences between different patients, it is necessary to utilize reference values from non-pathological regions. To this end the magnitude and position of voxels whose MR spectrum is to be determined can be indicated, via the interactive input unit, in a conventionally formed MR image displayed on the monitor 7.

FIG. 2 shows the position in time of various signals in a sequence for carrying out the invention. The sequence is subdivided into three time intervals $t_0$–$t_1$, $t_1$–$t_2$ and $t_2$–$t_3$. In the time interval $t_0$–$t_1$ a frequency-selective 90° RF pulse $RF_w$ is generated (first line). This pulse is tuned to the Larmor frequency of water-bound protons. Consequently, transverse magnetization is generated throughout the examination zone for these protons only, which transverse magnetization is subsequently dephased by a magnetic gradient field $G_{x1}$ (second line). It is thus achieved that these protons have hardly any effect on the further execution of the sequence.

In the time interval $t_1$–$t_2$ there is generated a slice-selective RF pulse $RF_s$ which ensures, in conjunction with a magnetic gradient field $G_{z1}$ (fourth line), that the nuclear magnetization is excited to both sides of a slice extending perpendicularly to the z-direction. This slice contains the voxels whose spectrum is to be determined. The transverse magnetization produced to both sides of said slice by the RF pulse $RF_S$ is dephased by a magnetic gradient field ($G_{y1}$, third line) so that the regions outside this slice, extending perpendicularly to the z-direction, have hardly any effect on the further execution of the MR examination.

In the time interval $t_2$–$t_3$, the phase in the voxels is two-dimensionally encoded by means of two one-dimensional, slice-selective RF pulses. The first RF pulse RF1 is a 90° pulse which produces transverse magnetization, in conjunction with a magnetic gradient field $G_{x2}$, in two slices which extend perpendicularly to the x-direction, have a thickness $\Delta x_1$ and $\Delta x_2$, and are situated at a distance x1 and x2, respectively, from the coordinate origin (see FIG. 3), the nuclear magnetization thus being rotated 90° out of its steady state. In that case there are two possibilities:

a) The transverse magnetization generated in the two slices has the same phase position. This can be achieved by means of an RF pulse RF1 whose envelope RF1$_{++}$ varies in time as follows:

$$RF1_{++}=A[\sin c(\Delta\omega_{11}t)\, e^{-j\Delta\Omega_{11}t}+\sin c(\Delta\omega_{12}t)e^{+j\Delta\Omega_{12}t}] \quad (1)$$

Therein:
sinc ( ) is the so-called sinc function, i.e. sine ( )/( ),
$\Delta\omega_{11}$ and $\Delta\omega_{12}$ are frequencies proportional to the slice thicknesses $\Delta x_1$ and $\Delta x_2$, respectively,
$\Delta\Omega_{11}$ and $\Delta\Omega_{12}$ are frequencies proportional to the distances between these layers and the coordinate origin,
A is the amplitude of RF1, and
t denotes time.

If these slices have the same thickness and the same distances x1 and x2 from the coordinate origin (in which the magnetic field strength depends exclusively on the main magnetic field and not on magnetic gradient fields) the equation (1) is simplified as follows:

$$RF1_{++}=2A \sin c(\Delta\omega_1 t) \cos(\Delta\Omega_1 t) \quad (1')$$

Therein, $\Delta\omega_1=\Delta\omega_{11}=\Delta\omega_{12}$ and $\Delta\Omega_1=\Delta\Omega_{11}=\Delta\Omega_{12}$.

b) The phase positions of the transverse magnetization generated in the two slices is opposed. For the temporal variation of the envelope RF1$_{+-}$ of this second version of the first RF pulse RF1 it then holds that:

$$RF1_{+-}=A[\sin c(\Delta\omega_{11}t)\, e^{-j\Delta\Omega_{11}t}-\sin c(\Delta\omega_{12}t)e^{+j\Delta\Omega_{12}t}] \quad (2)$$

The phase position of the vectors of the transverse magnetization in the two slices is then opposed. If the slices again have the same thickness and are situated at the same distance from the coordinate origin, the equation (2) is simplified as follows:

$$RF1_{+-}=2A \sin c(\Delta p\omega_1 t) \sin(\Delta\Omega_1 t) \quad (2')$$

Subsequent to the first RF pulse RF1 a magnetic gradient field $G_{z2}$ is switched on and off, so that the transverse magnetization in the two slices is first dephased again. However, since subsequently there is generated a 180° RF pulse RF2 which excites the nuclear magnetization in two slices extending perpendicularly to the y- direction, in conjunction with a magnetic gradient field Gy$_2$, and this RF pulse is succeeded by a magnetic gradient field $G_{z3}$ whose time integral exactly equals that over Gz$_2$, the dephasing effect of $G_{z2}$ is eliminated at the areas of intersection of the slices excited by RF1 and RF2. Similarly, a magnetic field gradient $G_{x3}$ whose time integral is that same as $G_{x2}$ is applied the same time as $G_{z3}$ to eliminate the dephasing effect of $G_{x2}$ at the area of intersection.

FIG. 3 shows the two slices having the thicknesses $\Delta y_1$ and $\Delta y_2$ and being situated at the distances $y_1$ and $Y_2$, respectively, from the coordinate origin. In conjunction with the two slices extending perpendicularly to the x-axis, they define four voxels $V_{11}$, $V_{12}$, $V_{21}$ and $V_{22}$ at their areas of intersection. A spin echo is generated in these voxels by the two RF pulses. The MR signal thus formed is acquired during acquisition gate Acq (fifth line of FIG. 2), the analog-to-digital converter 23 (FIG. 1) then being enabled by the control unit 5. The variation in time of the envelope of the second RF pulse RF2 is dependent on how it is to act on the two slices:

a) If it is meant to influence the nuclear magnetization in the two selected slices in the same way, the envelope of the second RF pulse should satisfy the equation:

$$RF2_{++}=B[\sin c(\Delta\omega_{21}t)\, e^{-j\Delta\Omega_{21}t}+\sin c(\Delta\omega_{22}t)e^{+j\Delta\Omega_{22}t}] \quad (3)$$

Therein:
B is an amplitude factor which corresponds to a flip angle of 180°,
$\Delta\omega_{21}$ and $\Delta\omega_{22}$ are frequency bands which are proportional to the slice thicknesses $\Delta y_1$ and $\Delta y_2$, respectively, and
$\Delta\Omega_{21}$ and $\Delta\Omega_{22}$ are frequencies which are proportional to the distances $y_1$ and $y_2$ between the slices and the coordinate origin. If the slices again have the same thickness and are situated at the same distance from the coordinate origin, the equation (3) is simplified as follows:

$$RF2_{++}=2B \sin c(\Delta\omega_2 t) \cos(\Delta\Omega_2 t) \quad (3')$$

Therein, $\Delta\omega_2=\Delta\omega_{21}=\Delta\omega_{22}$ and $\Delta\Omega_2=\Delta\Omega_{21}=\Delta\Omega_{22}$.

b) However, if the second pulse is meant to influence the transverse magnetization in the second slice in an opposed fashion in comparison with that in the first slice, the envelope of the second RF pulse should satisfy the relation $$RF2_{+-}=B[\sin c(\Delta\omega_{21}t)\, e^{-j\Delta\Omega_{21}t}+j\sin c(\Delta\omega_{22}t)e^{+j\Delta\Omega_{22}t}] \quad (4)$$

It then acts on the second slice with a phase position which has been offset 90° with respect to the first slice. Subject to the above conditions, this equation is again simplified as follows:

$$RF2_{+-}=(1+j)B \sin c(\Delta\omega_2 t)[\cos(\Delta\omega_2 t)-\sin(\Delta\Omega_2 t)] \quad (4'')$$

In order to enable separate determination of the MR spectrum in the four individual voxels $V_{11}$ ... $V_{22}$, the phase in these four voxels must undergo four linearly independent codes by way of the two RF pulses (i.e. none of the codes may result from a linear combination of the other codes). This is achieved when the four possible combinations of the envelopes are formed in four different sequences. This will be described in detail hereinafter with reference to the FIGS. 4a to 4d:

a) If the envelope of RF1 satisfies the equation (1) and the envelope of RF2 satisfies the equation (3), all four voxels $V_{11}$ ... $V_{22}$ experience the same phase encoding as symbolized by four plus signs in FIG. 4a.

b) If the envelope of the first RF pulse RF1 satisfies the equation (2) and the envelope of the second RF pulse again satisfies the equation (3), the voxels $V_{11}$ and $V_{12}$ experience the same phase encoding, whereas the voxels $V_{21}$ and $V_{22}$ in the right-hand slice are given an opposed phase encoding as expressed by the two minus signs in the right-hand column in FIG. 4b.

c) If a first RF pulse RF1 having an envelope in conformity with the equation (1) is succeeded by a second RF pulse having an envelope in conformity with the equation (4), the phase encoding of the upper two voxels $V_{11}$ and $V_{21}$ remains the same, whereas $V_{12}$ and $V_{22}$ have an opposed phase encoding because the part of the second RF pulse RF2 which influences the lower slice has a phase position which has been offset 90° with respect to the part acting on the upper slice. This yields the configuration with two plus signs in the upper row and two minus signs in the lower row as shown in FIG. 4c.

d) Finally, if the first RF pulse, having an envelope in conformity with the equation (2), and the second RF pulse, having an envelope in conformity with the equation (4), cooperate, the same phase encoding (+) is obtained for the voxel $V_{11}$ as in the FIGS. 4a to 4c.

However, the phase encoding of $V_{12}$ is inverted by RF2 and the phase encoding of $V_{21}$ by RF1. The phase of $V_{22}$ is inverted by RF1 as well as by RF2, resulting in the same phase position as in $V_{11}$. The code shown in FIG. 4d is thus obtained.

The encoding diagram shown in the FIGS. 4a to 4d corresponds to a four-point Hadamard transformation. Therefore, from the four MR signals arising for the phase encoding generated in the FIGS. 4a to 4d the MR spectrum of the individual voxels $V_{11} \ldots V_{22}$ can be determined by inverse Hadamard transformation. When the MR signals acquired with the phase encoding shown in the FIGS. 4a to 4d and arising from the spin echos in the voxels (fifth line of FIG. 2) are referred to as Sa, Sb, Sc, Sd, the MR spectrum for the voxel $V_{11}$ can be derived from the sum of the signals Sa . . . Sd, or from the Fourier transform of this sum, whereas, for example, the MR signal for $V_{22}$ is obtained by subtracting the signals Sb and Sc from the sum of the signals Sa and Sd.

During spectroscopic examinations comparatively long repetition times of a few seconds occur in order to ensure that the transverse magnetization has sufficiently relaxed before it is excited again. This results in comparatively long measuring times for the acquisition of the necessary MR signals. However, according to the method of the invention within a repetition time several groups of voxels can be successively excited and the associated MR signal read, i.e. before the transverse magnetization has relaxed; this is achieved by repeating the signals in the period $t_0-t_3$ (or only the signals of the period $t_2-t_3$) directly subsequently, be it while exciting slices which were not previously excited. This enables the spectra to be determined for a larger number of voxels without additional measuring time being required. For a field consisting of 4×4 voxels this is illustrated by the FIGS. 5a and 5b in conjunction with FIG. 6.

As is shown in FIG. 5a, this field is subdivided into two region patterns, each region pattern comprising the voxels which can be simultaneously excited and refocused without influencing one another. The voxels belonging to the same region pattern are denoted by the same reference (1 or 2). The remaining voxels can again be grouped in two region patterns in conformity with FIG. 5b, so that the region patterns A1 and A2 of FIG. 5a can be successively excited within one repetition period TR, the region patterns B1 and B2 of FIG. 5b being excited during the subsequent repetition period. The temporal sequence of the excitations is shown in FIG. 6. The two sequences must be repeated four times so as to obtain the encoding diagram shown in the FIGS. 4a to 4d; the MR spectrum associated with each of the sixteen voxels can thus be determined by means of a total of eight repetition periods.

The advantage resides in the fact that because of this interleaved excitation the repetition period TR can be effectively used so that the measuring time is reduced without giving rise to a loss of signal. A further advantage consists in that the size of the voxels may be made different in order to enhance the resolution in a pathological region. For example, in the pattern shown in FIG. 5a the outer slices, whereto the voxels A1 belong, may be made thicker than the inner slices with the elements A2. Furthermore, the described method can be combined with conventional methods, for example in order to enhance the spatial resolution in each voxel by additional encoding gradients.

FIGS. 7a to 7d illustrate how a field of 8×8 voxels can be subdivided so that four different subdivisions A . . . D are obtained as shown in the FIGS. 7a to 7d, each subdivision comprising four region patterns which can be successively excited and refocused during a sequence without influencing one another. As is shown in FIG. 8, therefore, the four region patterns belonging to a subdivision can be successively excited and refocused during one repetition period so that only four sequences are required for exciting all voxels once. In order to excite all voxels with the required phase encoding, these four sequences must be repeated four times, so that a total number of 16 sequences suffices to determine the MR spectra of 64 voxels.

Generally speaking, fields comprising n times n voxels can be excited, the number of excitations being dependent on how many voxels are contained in a region pattern. If this number is denoted by the reference L, the value L should be chosen so that 2N/L is integer, thus imposing the number of excitations and refocusing operations during the duration TR of a sequence.

In the foregoing embodiment the two RF pulses RF1 and RF2 always excite two mutually perpendicular slices. The slices, however, need not necessarily extend perpendicularly to one another, but may also intersect one another at an angle other than zero. Moreover, more than two slices can be simultaneously excited; however, on the other hand it is also possible to excite only one slice by means of one of the two RF pulses RF1 or RF2, but two or more slices by means of the respective other RF pulse.

Instead of performing phase encoding in conformity with a Hadamard transformation, other linear combinations of the excitation are also possible, for example in conformity with a Wavelet transformation or a Fourier transformation; the Hadamard transformation, however, has been found to be very attractive.

The described method can also be combined with a multi-echo approach (with further refocusing pulses). The T2 constants of the spectral components of a region pattern can thus be determined. However, several columns (or rows) of region patterns can also be measured, be it that a different T2-weighting is then applied between the columns (or rows).

We claim:

1. An MR spectroscopy method in which the nuclear magnetization of a plurality of voxels present at intersections of slices is simultaneously excited by sequences which are repeated a number of times, a phase encoding of the voxels then occurring being varied from one sequence to another and a spectral distribution of the nuclear magnetization in the voxels being derived from linear combinations of the MR signals generated in the individual sequences, wherein in each sequence a first slice-selective RF pulse is generated in order to excite transverse magnetization in one or more first slices, and subsequently a second slice-selective RF pulse is generated in order to refocus the nuclear magnetization in one or more second slices which intersect the first slices at an angle other than zero, there being at least more than one first slices or more than one second slices so that plural voxels are formed at the intersections of the slices, and in the various sequences the MR signals produced by spin echos in the voxels at the intersections of the first and second slices are acquired and used to determine the spectral distribution of nuclear magnetization.

2. An MR spectroscopy method as claimed in claim 1, wherein, prior to the first RF pulse, at least one slice-selective RF pulse which is succeeded by a magnetic gradient field excites and dephases the nuclear magnetization in the areas to both sides of a slice which extends at an angle other than zero with respect to the first and second slices.

3. An MR spectroscopy method as claimed in claim 1, wherein within one repetition period said method is successively applied to at least two region patterns which consist of a plurality of voxels which are arranged in such a manner that their nuclear magnetization is excited and refocused only once within a repetition period.

4. An MR spectroscopy method as claimed in claim 1, characterized in that each sequence includes, prior to the first RF pulse (RF1), the excitation of the nuclear magnetization of the water-bound protons by at least one frequency-selective RF pulse (RF2) and the subsequent dephasing of this nuclear magnetization by magnetic gradient fields ($G_{x1}$).

5. An MR spectroscopy method as claimed in claim 1, wherein in each sequence a first magnetic gradient field is generated in the interval between the first and second RF pulses and in the interval between the second RF pulse and the acquisition of the MR signals there is generated a second magnetic gradient field whose time integral has the same value as that of the first magnetic gradient field.

6. An MR apparatus comprising:

a) an RF coil system for generating RF pulses, b) a gradient coil system for generating temporally variable magnetic gradient fields, c) a receiving coil system for receiving MR signals, d) a control unit for controlling the RF coil, gradient coil and receiving coil system in such a manner that sequences are generated including a first slice-selective RF pulse for exciting nuclear magnetization in one or more first slices, and a second slice-selective RF pulse for refocusing the nuclear magnetization in one or more second slices which intersect the first slices at an angle other than zero, there being at least more than on first slices or more than one second slices so that a plurality of voxels are present at the intersections of the first and second slices, phase encoding of the voxels is varied from one sequence to another, MR signals occurring as spin-echos in the sequences are acquired, linear combinations of the MR signals, or MR signals and data linearly derived therefrom, are formed in order to determine a spectral nuclear magnetization distribution in a region.

* * * * *